(12) United States Patent
Huang et al.

(10) Patent No.: US 12,074,564 B2
(45) Date of Patent: Aug. 27, 2024

(54) ENVIRONMENT-FRIENDLY PHOTOVOLTAIC MODULE MANUFACTURING PROCESS AND PHOTOVOLTAIC MODULE

(71) Applicants: ZHEJIANG JINKO SOLAR CO., LTD., Haining (CN); JINKO SOLAR CO., LTD., Jiangxi (CN)

(72) Inventors: Long Huang, Haining (CN); Zhiqiu Guo, Haining (CN); Junhui Liu, Haining (CN); Xinxin Gong, Haining (CN); Qingchen Hao, Haining (CN)

(73) Assignees: Zhejiang Jinko Solar Co., Ltd., Haining (CN); Jinko Solar Co., Ltd., Jiangxi (CN)

( * ) Notice: Subject to any disclaimer, the term of this patent is extended or adjusted under 35 U.S.C. 154(b) by 682 days.

(21) Appl. No.: 17/192,734

(22) Filed: Mar. 4, 2021

(65) Prior Publication Data
US 2022/0224285 A1    Jul. 14, 2022

(30) Foreign Application Priority Data
Jan. 8, 2021    (CN) .......................... 202110025960.3

(51) Int. Cl.
*H02S 40/34*    (2014.01)
*B23K 11/00*    (2006.01)
(Continued)

(52) U.S. Cl.
CPC ............ *H02S 40/34* (2014.12); *B23K 11/002* (2013.01); *H01L 31/02008* (2013.01);
(Continued)

(58) Field of Classification Search
CPC ...... H02S 40/34; H02S 40/345; H01F 27/327; H01L 31/02008; H01L 31/18; H01L 31/0481; B23K 2101/36; B23K 11/002
See application file for complete search history.

(56) References Cited

U.S. PATENT DOCUMENTS

2012/0176724 A1* 7/2012 Burrows ............... H01F 27/327
                                                      361/263
2017/0005215 A1* 1/2017 Wang ....................... H02S 40/34

FOREIGN PATENT DOCUMENTS

| CN | 106330089 A | | 1/2017 |
| JP | 2017135891 A | * | 8/2017 |
| WO | WO 2015/096491 A1 | | 7/2015 |

OTHER PUBLICATIONS

Wu et al., "Thermomechanical Stress Distribution Analysis of Junction Box on Silicon Photovoltaic Modules Based on Finite Element Analysis," in IEEE Journal of Photovoltaics, vol. 9, No. 6, pp. 1716-1720, Nov. 2019. (Year: 2019).*

(Continued)

*Primary Examiner* — A. Dexter Tugbang
(74) *Attorney, Agent, or Firm* — Knobbe, Martens, Olson & Bear, LLP

(57) ABSTRACT

An environment-friendly photovoltaic module manufacturing process and a photovoltaic module are provided. The environment-friendly photovoltaic module manufacturing process includes: preparing a solar cell assembly; fixing a junction box on the solar cell assembly in such a manner that a bus bar of the solar cell assembly is introduced into the junction box; fixing the bus bar to a metal slice in the junction box by welding; injecting a highly thermal conductive silica gel into the junction box; and curing the highly thermal conductive silica gel. The junction temperature of the junction box can be reduced by means of combining the junction box and the highly thermal conductivity silica gel (Continued)

with a high thermal conductivity, so that the junction box can withstand higher temperature, and can be used in the photovoltaic module with large cell size and high current requirements.

13 Claims, 2 Drawing Sheets

(51) Int. Cl.
    *H01L 31/02*     (2006.01)
    *H01L 31/18*     (2006.01)
    *B23K 101/36*     (2006.01)
    *H01L 31/048*     (2014.01)

(52) U.S. Cl.
    CPC .......... *H01L 31/18* (2013.01); *B23K 2101/36* (2018.08); *H01L 31/0481* (2013.01)

(56) References Cited

OTHER PUBLICATIONS

Machine Translation of CN 106330089, Dec. 2023. (Year: 2023).*
Extended European Search Report issued in Application No. 21160803.9-1230 on Aug. 2, 2021 (reference No. 44270040EP) in 11 pages.

* cited by examiner

ENVIRONMENT-FRIENDLY PHOTOVOLTAIC MODULE MANUFACTURING PROCESS AND PHOTOVOLTAIC MODULE

CROSS-REFERENCE TO RELATED APPLICATIONS

The present application claims priority to Chinese Patent Application No. 202110025960.3, filed on Jan. 8, 2021, the content of which is incorporated herein by reference in its entirety.

TECHNICAL FIELD

The present disclosure relates to the technical field of photovoltaic module manufacturing technology, and, in particular, to an environment-friendly photovoltaic module manufacturing process and a photovoltaic module.

BACKGROUND

A photovoltaic module is generally connected to an external electronic control device via a junction box. The junction box may be glued to the photovoltaic module, and a bus bar in the photovoltaic module outputs a current to the outside through the junction box.

However, with the development and breakthrough of photovoltaic module manufacturing technology, sizes of silicon wafers and photovoltaic modules continue to increase, which leads to a great challenge to the junction temperature of the junction box. The junction box can hardly bear a high temperature, which easily cause safety hazards.

SUMMARY

A purpose of the present disclosure is to provide an environment-friendly photovoltaic module manufacturing process and a photovoltaic module, which can solve the above-mentioned problems in the related art and reduce the junction temperature of the junction box.

A first aspect of the present disclosure provides an environment-friendly photovoltaic module manufacturing process, including: preparing a solar cell assembly; fixing a junction box on the solar cell assembly in such a manner that a bus bar of the solar cell assembly is introduced into the junction box; fixing the bus bar to a metal slice in the junction box by welding; injecting a highly thermal conductive silica gel into the junction box; and curing the highly thermal conductive silica gel.

In an embodiment, the highly thermal conductive silica gel is an addition-curable highly thermal conductive silica gel or a condensation-curable highly thermal conductive silica gel.

In an embodiment, the condensation-curable highly thermal conductive silica gel includes a first component and a second component; the first component includes 100 parts by mass of hydroxyl-terminated polydimethylsiloxane, 60-100 parts by mass of an inorganic filler, and 5-15 parts by mass of a modified material; the second component includes 100 parts by mass of a crosslinking agent, 25-50 parts by mass of a coupling agent, and 0.5-2.5 parts by mass of a catalyst; and the first component and the second component are mixed in a mass ratio and cured for a time period.

In an embodiment, a mass ratio of the first component to the second component is in a range from 5/1 to 15/1; and the time period is in a range from 5 min to 120 min.

In an embodiment, the inorganic filler is selected from the group consisting of a highly thermal conductive metal oxide, silicon micro powder, boron nitride, calcium sulfate, and combinations thereof.

In an embodiment, the bus bar is fixed to the metal slice by a resistance welding process.

In an embodiment, the resistance welding process is operated with an input voltage in a range from 2 kV to 3 kV, a pressure in a range from 90N to 100N, and a welding time of 20 s.

In an embodiment, the bus bar is an electroplated nickel bus bar or an electroplated copper bus bar.

In an embodiment, the bus bar is an electroplated nickel bus bar, with a thickness of electroplated nickel in a range from 1 μm to 10 μm.

In an embodiment, the highly thermal conductive silica gel has a thermal conductivity greater than 0.6.

In an embodiment, introducing the bus bar of the solar cell assembly into the junction box includes: bending the bus bar at a position facing the junction box to form a bending portion; and introducing the bending portion to enter the junction box.

In an embodiment, fixing the junction box to the solar cell assembly includes: adhering the junction box onto the solar cell assembly via the highly thermal conductive silica gel.

In an embodiment, preparing the solar cell assembly includes: series welding solar cells to form a solar cell group; feeding a front plate; laying a front-side EVA film on the front plate; laying the solar cell group on the front EVA film; welding the bus bar on the solar cell group; laying a back-side EVA film on the solar cell group; laying a back plate on the back-side EVA film; and laminating and fixing the front plate, the front-side EVA film, the solar cell group, the back-side EVA film and the back plate.

A second aspect of the present disclosure provides a photovoltaic module manufactured by the environment-friendly photovoltaic module manufacturing process according to any one of the forgoing embodiments, the photovoltaic module including the solar cell assembly and the junction box fixed on the solar cell assembly, the junction box is provided with the metal slice inside, the metal slice is welded to the bus bar in the solar cell assembly, and the junction box is filled with the highly thermal conductive silica gel.

In an embodiment, the junction box is provided with a through hole, and the metal slice extends in an axial direction of the through hole; and the bus bar enters the junction box through the through hole, and a portion of the bus bar entering the junction box is welded and fixed to the metal slice.

The technical solutions provided by the present disclosure can at least achieve the following beneficial effects:

the environment-friendly photovoltaic module manufacturing process and the photovoltaic module provided by the present disclosure can reduce the junction temperature of the junction box by means of combining the junction box and the highly thermal conductivity silica gel with a high thermal conductivity, so that the junction box can withstand higher temperature, and can be used in the photovoltaic module with large cell size and high current requirements.

It should be understood that the above general description and the following detailed description are only illustrative and do not limit the present application.

REFERENCE SIGNS

Figure 1:
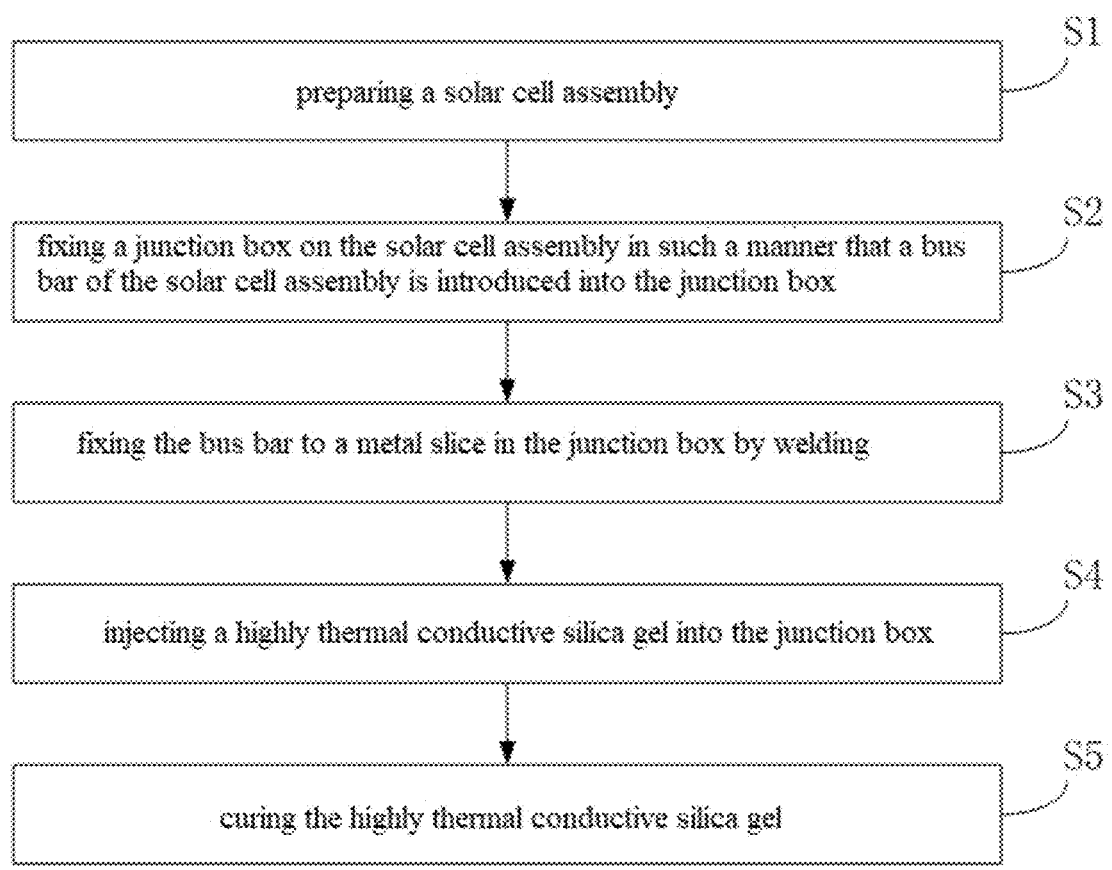
FIG. 1 is a flow chart of an environment-friendly photovoltaic module manufacturing process according to an embodiment of the present disclosure.

1—Junction box
11—Metal slice
12—Through hole
2—Bending portion

The drawings herein are incorporated into the specification and constitute a part of the specification, which shows embodiments of the present disclosure, and are used to explain the principle of the present disclosure together with the description.

DESCRIPTION OF EMBODIMENTS

In order to better understand objects, technical solutions and advantages of the present disclosure, the present disclosure is further described below in details with reference to the accompanying drawings and embodiments. It should be understood that the specific embodiments described here are only used to explain the present disclosure, but not to limit the present disclosure.

In the description of the present disclosure, unless otherwise expressly stipulated and limited, the terms "first" and "second" are only used for descriptive purposes, but not for indicating or implying relative importance. Unless otherwise stipulated or stated, the term "a plurality of" refers to two or more; the terms "connected" and "fixed" should be understood in a broad sense. For example, "connected" may be fixedly connected, detachably connected, integrally connected, or electrically connected, and may be directly connected, or indirectly connected through an intermediate medium. For those skilled in the art, the specific meanings of the above terms in the present disclosure may be understood according to specific circumstances.

It should be understood that, in the description of this specification, the orientation terminologies, such as, "above" and "under", described in the embodiments of the present disclosure are described according to the angle shown in the drawings, and should not be construed as limiting the embodiments of the present disclosure. In addition, it should also be understood that, in the context, when one element is connected "above" or "under" another element, the one element may be directly connected "above" or "under" another element, or the one element may be indirectly connected "above" or "under" another element through an intermediate element.

As shown in FIG. 1, the present disclosure provides an environment-friendly photovoltaic module manufacturing process. The environment-friendly photovoltaic module manufacturing process includes following steps S1 to S5.

Step S1: a solar cell assembly is prepared.

The solar cell assembly may be formed by combining a plurality of cell strings. Each cell string may be manufactured by series welding a plurality of solar cells.

Step S2: a junction box is fixed to the solar cell assembly in such a manner that a bus bar of the solar cell assembly is introduced into the junction box.

Step S3: the bus bar is fixed to a metal slice in the junction box by welding.

With the junction box connected to the bus bar, the plurality of cell strings of the solar cell assembly can be connected in series.

Step S4: a highly thermal conductive silica gel is injected into the junction box.

It shall be noted that a thermal conductivity of conventional silica gels is generally in a range from 0.3 to 0.4. When a current of the solar cell assembly is increased, the temperature of an existing junction box with a conventional silica gel may increase due to the low thermal conductivity of the conventional silica gel. If the temperature of the junction box is excessively high, it tends to cause safety hazards such as decomposition of the silica gel, damage of the junction box, melting of the bus bar, etc. In addition, in the related art, in order to reduce the junction temperature of the junction box, the number of diodes in the junction box is generally increased, or the area of a heat dissipation metal sheet in the junction box is increased, in order to form a high-current junction box that can withstand higher temperatures and currents. However, such high-current junction box may bring higher cost with a limited heat dissipation effect.

For this purpose, in an embodiment, a new highly thermal conductive silica gel is used. This highly thermal conductive silica gel has a thermal conductivity much higher than that of conventional silica gels. Even if the size of the solar cell is increased or the current increases, the junction box is capable of withstanding a higher temperature change, therefore the junction temperature of the junction box is reduced without the need to increase the number of diodes inside the junction box and modify the metal sheet inside the junction box.

For an existing 21× photovoltaic module which refers to a photovoltaic module composed of solar cells with a length and a width both in a range from 210 mm to 220 mm, a scheme in which a junction box having a rated current of 30 A is combined with a conventional silica gel having a thermal conductivity of 0.3 is used, and the junction temperature of the junction box with a rated current of 30 A is 198.2° C. In an embodiment of the present disclosure, the 21× photovoltaic module adopts a scheme in which a junction box with a rated current of 25 A is combined with a highly thermal conductive silica gel having a thermal conductivity of 1.5, and the junction temperature of the junction box with a rated current of 25 A is 195.2° C. Therefore, in this embodiment, the scheme in which a junction box with a rated current of 25 A is combined with a highly thermal conductive silica gel having a thermal conductivity of 1.5 can achieve the technical indicators of the existing scheme in which a conventional junction box with a rated current of 30 A is combined with a conventional silica gel having a thermal conductivity of 0.3. That is, in this embodiment, the highly thermal conductive silica gel having a thermal conductivity of 1.5 can effectively reduce the junction temperature of the junction box, and therefore the junction box with a smaller rated current can meet the temperature requirements of the junction box with a larger rated current, and therefore can be used instead of the junction box with a larger rated current, thereby reducing the cost.

In addition, for an existing 18× photovoltaic module which refers to a photovoltaic module composed of solar cells with a length and a width both in a range from 180 mm to 190 mm, a scheme in which a junction box having a rated current of 25 A is combined with a conventional silica gel having a thermal conductivity of 0.3 is used, and the junction temperature of the junction box with a rated current of 25 A is 197.7° C. In an embodiment of the present disclosure, the 18× photovoltaic module adopts a scheme in which a junction box with a rated current of 20 A is combined with a highly thermal conductive silica gel having a thermal conductivity of 1.5, and the junction temperature of the junction box with a rated current of 20 A is 194.4° C. Therefore, in this embodiment, the scheme in which a junction box with a rated current of 20 A is combined with a highly thermal conductive silica gel with a thermal conductivity of 1.5 can achieve the technical indicators of the existing scheme in which a conventional junction box with a rated current of 25 A is combined with a conventional silica gel with a thermal conductivity of 0.3, and the junction temperature of the junction box with a rated current of 20 A can be effectively reduced.

Step S5, the highly thermal conductive silica gel is cured. After the highly thermal conductive silica gel is cured, the cured highly thermal conductive silica gel can further achieve connecting reliability between the bus bar and the metal slice. Meanwhile, the cured highly thermal conductive silica gel is sufficiently in contact with the bus bar and the metal slice, which is beneficial to conduct heat and reduce the junction temperature of the junction box.

In an embodiment of the present disclosure, the highly thermal conductive silica gel may be an addition-curable highly thermal conductive silica gel or a condensation-curable highly thermal conductive silica gel. The addition-curable highly thermal conductive silica gel has a relatively higher thermal conductivity that is generally greater than 0.6. It has excellent thermal conductivity and a large room for improvement in thermal conductivity, and can maintain elasticity over a long time period in a temperature range from −65° C. to 200° C. In addition, the addition-curable highly thermal conductive silica gel also has excellent electrical property, chemical stability, water resistance, ozone resistance, radiation resistance, weathering resistance, water and moisture resistance, anti-vibration, low compression deformation and low flammability, as well as advantages as being physiological inert, non-toxic, tasteless, and easily controllable in vulcanization rate by temperature.

The condensation-curable highly thermal conductive silica gel may be added with a highly thermal conductive filler to obtain a thermal conductivity greater than 0.6, thereby increasing an overall thermal conductivity.

In an embodiment of the present disclosure, the condensation-curable highly thermal conductive silica gel includes a first component and a second component. The first component includes 100 parts by mass of hydroxyl-terminated polydimethylsiloxane, 60-100 parts by mass of an inorganic filler, and 5-15 parts by mass of a modified material. The second component includes 100 parts by mass of a cross-linking agent, 25-50 parts by mass of a coupling agent, and 0.5-2.5 parts by mass of a catalyst.

The first component and the second component are mixed according to a preset mass ratio and cured for a preset time. The condensation-curable high thermal conductive silica gel thus obtained can have good thermal conductivity, and therefore it can greatly reduce the junction temperature of the junction box, thereby enabling the junction box to withstand higher temperatures.

The mass ratio of the first component to the second component may be in a range from 5/1 to 15/1, and the curing time may be in a range from 5 min to 120 min. In an embodiment, the mass ratio of the first component to the second component is 8/1, 9/1 or 10/1. The curing time is in a range from 60 min to 90 min.

In an embodiment of the present disclosure, the inorganic filler may be selected form the group consisting of a highly thermal conductive metal oxide, silicon micro powder, boron nitride, calcium sulfate, and combinations thereof.

The highly thermal conductive metal oxide may be aluminum oxide, aluminum hydroxide, titanium dioxide or the like. Aluminum oxide is used in an embodiment.

In addition, the modified material may be a water-in-oil silicone emulsion, low-viscosity silicone oil, a combination thereof, and the modified material may be used as a toughening agent, a curing-facilitating agent. The crosslinking agent may be selected from the group consisting of tetraethoxysilane, methyltrimethoxysilane, methyltriethoxysilane, and combinations thereof. The crosslinking agent is crosslinked with the host polymer to achieve curing.

The coupling agent may be selected from the group consisting of hexamethyldisilazane, γ-aminopropyltriethoxysilane, silatrane compounds, and combinations thereof. The coupling agent promotes bonding of the system.

The catalyst may be dibutyl tin dilaurate or dibutyl tin diacetate, which can increase a crosslinking reaction speed of the system.

In an embodiment of the present disclosure, the first component includes 100 parts by mass of hydroxyl-terminated polydimethylsiloxane, 80 parts by mass of the inorganic filler, and 10 parts by mass of the modified material, and the second component includes 100 parts by mass of the crosslinking agent, 35 parts by mass of the coupling agent, and 1.2 parts by mass of the catalyst. The first component and the second component are mixed in a mass ratio of 10/1 and cured for 50 min.

In another embodiment of the present disclosure, the first component includes 100 parts by mass of hydroxyl-terminated polydimethylsiloxane, 85 parts by mass of the inorganic filler, and 8 parts by mass of the modified material, and the second component includes 100 parts by mass of the crosslinking agent, 30 parts by mass of the coupling agent, and 2 parts by mass of the catalyst. The first component and the second component are mixed in a mass ratio of 12/1 and cured for 80 min.

As an implementation manner, the bus bar is fixed to the metal slice by a resistance welding process. In the specific operation process, the bus bar and the metal slice can be locally heated using the resistance heat generated by a current passing through the weldment and a contact position thereof as a heat source in such a manner that the bus bar and the metal slice are in a melting or shaping state, thereby realizing reliable connection and fixation between the bus bar and the metal slice.

When welding with the resistance welding process, there is no need to fill welding tin, and the process is therefore lead-free while having high productivity and small deformation of the weldment, and is easy to realize automation, and cost-saving. A current of 2-3 kV, a pressure of 90-100N, and a welding temperature greater than 300° C. may be used to realize local heating and reliable welding of the bus bar and the metal slice in the junction box.

As an embodiment, the highly thermal conductive silica gel is an addition-curable highly thermal conductive silica gel, and the bus bar is an electroplated nickel bus bar or an electroplated copper bus bar. In an embodiment, the bus bar is an electroplated nickel bus bar.

Since the addition-curable highly thermal conductive silica gel is prone to react with elements such as tin (Sn) and lead (Pb) to poison the catalyst and then affect curing, using the electroplated nickel bus bar can achieve a lead-free process, which in combination with the resistance welding technology can eliminate the use of welding tin, thereby avoiding the catalyst poisoning reaction between the addition-curable highly thermal conductive silica gel and the elements such as tin (Sn) and lead (Pb).

In an embodiment, a contrast experiment is performed between welding of a conventional lead-containing bus bar by a manual welding process and welding of an electroplated nickel bus bar by the resistance welding process in the present disclosure. The experimental data are shown in Table 1 below.

TABLE 1

| Welding process | Catalyst poisoning situation | Silica gel curing situation |
|---|---|---|
| Manual welding | Poisoned | The silica gel material is flowable and viscous, and is not cured after 72 h |
| Resistance welding | Not poisoned | The silica gel material is completely cured after 4 h |

It can be seen from Table 1 that when the conventional lead-containing bus bar is welded by the manual welding process, the tin element contained in the solder and the lead element in the bus bar react with the silica gel to poison the catalyst, thereby causing curing failure of the silica gel. However, when the electroplated nickel bus bar is welded by the resistance welding process in the present disclosure, there are no elements such as tin and lead that cause catalyst poisoning, so that the highly thermal conductive silica gel can be completely cured after 4 hours.

The thickness of the electroplated nickel of the electroplated nickel bus bar may be in a range from 1 μm to 10 μm. In an embodiment of the present disclosure, the thickness of the electroplated nickel is in a range from 4 μm to 6 μm. When the electroplated nickel has a different thickness, the bus bars can have a different welding tensile strength and a different welding reliability with the metal slice. In this embodiment, six groups of bus bar samples were subjected to a tensile test on welds according to GB/T 2651-2008 (equivalent to ISO 4136: 2001), and the test results are shown in Table 2 below.

TABLE 2

| Thickness of electroplated nickel (μm) | Welding situation | Tensile strength of welds (N) |
|---|---|---|
| 2 | Non welded | 0.48 |
| 3 | Non welded | 1.35 |
| 4 | Welded | 3.48 |
| 5 | Welded | 3.55 |
| 6 | Welded | 4.33 |
| 7 | Non welded | 1.54 |

It may be seen from Table 2 that when the thicknesses of the electroplated nickels are 2 μm, 3 μm and 7 μm, the bus bar and the metal slice may not be effectively welded, and the tensile strengths of the welds are relatively small, which are 0.48N, 1.35N and 1.54N, respectively. However, when the thicknesses of the electroplated nickels are 4 μm, 5 μm and 6 μm, the bus bar and the metal slice can be effectively welded and fixed, and the tensile strengths of the welds are relatively large, which are 3.48N, 3.55N and 4.33N respectively. Therefore, when the thickness of the electroplated nickel is in the range from 4 μm to 6 μm, it provides a good tensile strength of the weld and can achieve effective welding with the metal slice.

As an embodiment, in the Step S2, introducing the bus bar of the solar cell assembly into the junction box 1 includes: Step S21 of bending the bus bar at a preset position facing to the junction box 1 to form a bending portion 2; and Step S22 of introducing the bending portion 2 to enter the junction box 1.

Figure 2:
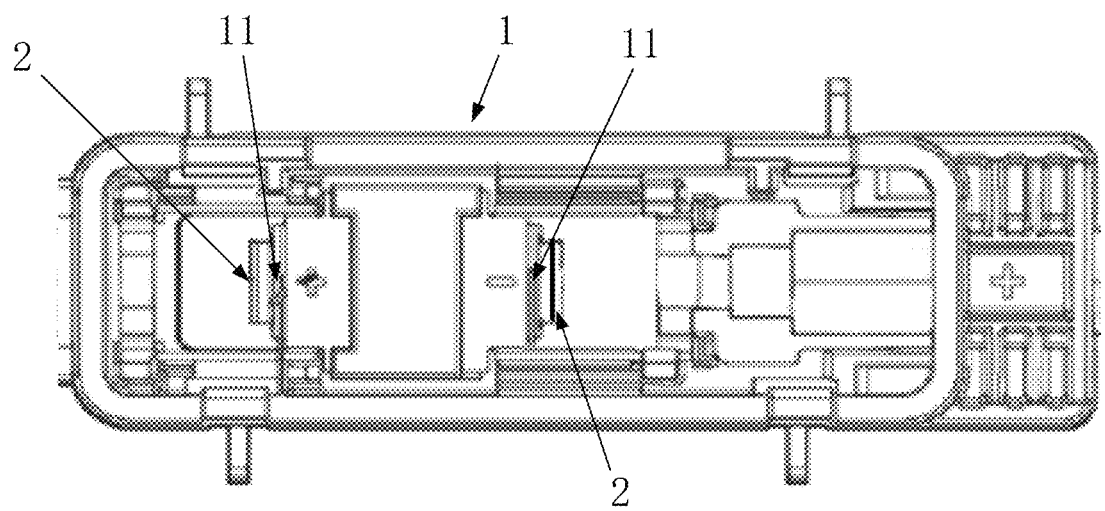
FIG. 2 is a top view of a junction box according to an embodiment of the present disclosure.
Figure 3:
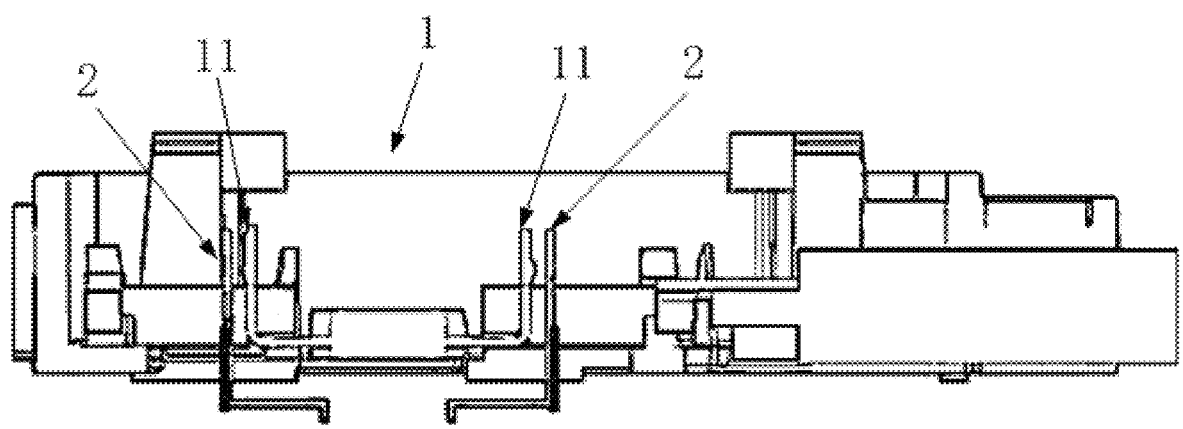
FIG. 3 is a cross-sectional view of a junction box according to an embodiment of the present disclosure.

As shown in FIGS. 2 and 3, after the bus bar extends along the surface of the solar cell assembly to an outside of the edge of the solar cell assembly, bending may be performed once. In an embodiment, a bending angle is 90°, and the bending portion 2 formed is perpendicular to the surface of the solar cell assembly. The bending portion 2 may directly enter the junction box 1 through a through hole 12 of the junction box 1 to be attached to the metal slice 11. Therefore, without bending the bending portion 2 a second time, the bending portion 2 and the metal slice 11 may be directly welded and fixed by the resistance welding process. For the manual welding method in the related art, the bending portion 2 needs to be bent twice in order to facilitate manual welding, but the twice bending of the bus bar may aggravate fatigue degree of the bus bar. However, with the above-mentioned welding method according to the present disclosure, the bus bar is required to be bent just once. Meanwhile, the use of the resistance welding technology can improve welding efficiency and welding quality, thereby obtaining high automation degree and saving manpower.

In addition, in step S2, the junction box may be adhered to the solar cell assembly via a highly thermal conductive silica gel. After the highly thermal conductive silica gel is cured, the junction box may be reliably fixed to the solar cell assembly. The highly thermal conductive silica gel can dissipate heat on the shell of the junction box, so that the temperature of the junction box can be reduced.

As an embodiment, the step S1 includes following steps S11 to S18.

Step S11: solar cells are series welded to form a solar cell group. The solar cell group may be formed by a plurality of cell strings.

Solar cells may be series welded automatically by a series welding machine, non-defective products enter a next step, and defective cell strings are to be repaired.

Step S12: a front plate is fed. The front plate is made of a light transmissive material, e.g., a glass material.

Step S13: a front-side EVA film is laid on the front plate.

Step S14: the solar cell group is laid on the front-side EVA film.

The series welded solar cell group may be laid on the front-side EVA film by an automatic string laying machine. Then spacing between the cell strings is fine-tuned, and a high temperature tape is adhered to fix the cell strings.

Step S15: the bus bar is welded on the solar cell group.

Step S16: a back-side EVA film is laid on the solar cell group.

Step S17: a back plate is laid on the back-side EVA film.

Further, defects such as subfissures, broken fragments, insufficient welding, and mixing may be detected by an EL detector. Foreign objects, cell string deviation and other problems may be checked by microscopic inspection. The defective products are repaired.

Further, the laminated assembly may be inspected for foreign matters, the redundant EVA at the edges may be trimmed off, the front plate and the back plate are aligned, and the edges may be sealed with an edge sealing glue.

Step S18, the front plate, the front-side EVA film, the solar cell group, the back-side EVA film and the back plate are laminated and fixed to obtain a solar cell assembly.

The present disclosure also provides a photovoltaic module, which is manufactured using the environment-friendly photovoltaic module manufacturing process provided the above embodiments of the present disclosure. The photovoltaic module includes a solar cell assembly and a junction box 1. The junction box 1 is fixed on the solar cell assembly. The junction box 1 is provided with a metal slice 11 inside. The metal slice 11 is welded to the bus bar in the solar cell assembly. The junction box 1 is filled with a highly thermal conductive silica gel.

The highly thermal conductive silica gel has a thermal conductivity much higher than that of conventional silica gels. Even if the size of the solar cell is increased or the current increases, the junction box 1 can withstand temperature rise, and therefore the junction temperature of the junction box is effectively reduced.

As shown in FIGS. 2 and 3, the junction box 1 is provided with a through hole 12, and the metal slice 11 extends in an axial direction of the through hole 12. The bus bar partially enters the junction box 1 through the through hole 12. A part of the bus bar entering the junction box 1 is welded and fixed to the metal slice 11.

The bus bar may be bent once after extending along a surface of the solar cell assembly to an outside of the edge of the solar cell assembly. In an embodiment, a bending angle may be 90°, and the bending portion 2 formed is perpendicular to the surface of the solar cell assembly. The bending portion 2 may directly enter the junction box 1 through the through hole 12 on the junction box 1 to be attached to the metal slice 11. Therefore, without bending the bending portion 2 a second time, the bending portion 2 and the metal slice 11 can be directly welded and fixed by the resistance welding process. For the manual welding method in the related art, the bending portion 2 needs to be bent twice in order to facilitate manual welding, but the twice bending of the bus bar may aggravate fatigue degree of the bus bar. However, with the above-mentioned welding method according to the present disclosure, the bus bar is required to be bent just once. Meanwhile, the use of resistance welding technology improves welding efficiency and welding quality, thereby obtaining high automation and saving manpower.

The above illustrates several embodiments of the present disclose, which is not intended to limit the present disclosure. Changes and modifications may be made by those skilled in the art without departing from the scope of the present disclosure. Whatever within the principles of the present disclosure, including any modification, equivalent substitution, improvement, etc., shall fall into the protection scope of the present disclosure.

What is claimed is:

1. An environment-friendly photovoltaic module manufacturing process, comprising:
    preparing a solar cell assembly;
    fixing a junction box on the solar cell assembly in such a manner that a bus bar of the solar cell assembly is introduced into the junction box;
    fixing the bus bar to a metal slice in the junction box by welding;
    injecting a highly thermal conductive silica gel into the junction box; and
    curing the highly thermal conductive silica gel;
    wherein the highly thermal conductive silica gel is a condensation-curable highly thermal conductive silica gel;
    wherein the condensation-curable highly thermal conductive silica gel comprises a first component and a second component;
    the first component comprises 100 parts by mass of hydroxyl-terminated polydimethylsiloxane, 60-100 parts by mass of an inorganic filler, and 5-15 parts by mass of a modified material;
    the second component comprises 100 parts by mass of a crosslinking agent, 25-50 parts by mass of a coupling agent, and 0.5-2.5 parts by mass of a catalyst; and
    the first component and the second component are mixed in a mass ratio and cured for a time period.

2. The environment-friendly photovoltaic module manufacturing process according to claim 1, wherein the mass ratio of the first component to the second component is in a range from 5/1 to 15/1; and
    the time period is in a range from 5 min to 120 min.

3. The environment-friendly photovoltaic module manufacturing process according to claim 1, wherein the inorganic filler is selected from the group consisting of a highly thermal conductive metal oxide, silicon micro powder, boron nitride, calcium sulfate, and combinations thereof.

4. The environment-friendly photovoltaic module manufacturing process according to claim 1, wherein the bus bar is fixed to the metal slice by a resistance welding process.

5. The environment-friendly photovoltaic module manufacturing process according to claim 4, wherein the resistance welding process is operated with an input voltage in a range from 2 kV to 3 kV, a force in a range from 90 N to 100 N, and a welding time of 20 s.

6. The environment-friendly photovoltaic module manufacturing process according to claim 4, wherein the bus bar is an electroplated nickel bus bar or an electroplated copper bus bar.

7. The environment-friendly photovoltaic module manufacturing process according to claim 4, wherein the bus bar is an electroplated nickel bus bar, with a thickness of electroplated nickel in a range from 1 μm to 10 μm.

8. The environment-friendly photovoltaic module manufacturing process according to claim 1, wherein the highly thermal conductive silica gel has a thermal conductivity greater than 0.6.

9. The environment-friendly photovoltaic module manufacturing process according to claim 1, wherein said introducing the bus bar of the solar cell assembly into the junction box comprises:
    bending the bus bar at a position facing the junction box to form a bending portion; and
    introducing the bending portion to enter the junction box.

10. The environment-friendly photovoltaic module manufacturing process according to claim 1, wherein said fixing the junction box to the solar cell assembly comprises:
    adhering the junction box onto the solar cell assembly via the highly thermal conductive silica gel.

11. The environment-friendly photovoltaic module manufacturing process according to claim 1, wherein preparing the solar cell assembly comprises:
    series welding solar cells to form a solar cell group;
    feeding a front plate;
    laying a front-side EVA film on the front plate;
    laying the solar cell group on the front-side EVA film;
    welding the bus bar on the solar cell group;
    laying a back-side EVA film on the solar cell group;
    laying a back plate on the back-side EVA film; and
    laminating and fixing the front plate, the front-side EVA film, the solar cell group, the back-side EVA film and the back plate.

12. A photovoltaic module manufactured by the environment-friendly photovoltaic module manufacturing process according to claim 1, the photovoltaic module comprising the solar cell assembly and the junction box fixed on the solar cell assembly, wherein the junction box is provided with the metal slice inside, the metal slice is welded to the bus bar in the solar cell assembly, and the junction box is filled with the highly thermal conductive silica gel.

13. The photovoltaic module according to claim 12, wherein the junction box is provided with a through hole, and the metal slice extends in an axial direction of the through hole; and the bus bar enters the junction box through the through hole, and a portion of the bus bar entering the junction box is welded and fixed to the metal slice.

\* \* \* \* \*